United States Patent
Tanaka et al.

(10) Patent No.: US 7,364,632 B2
(45) Date of Patent: Apr. 29, 2008

(54) RADIATOR MEMBER FOR ELECTRONIC APPLIANCES AND PROCESSES FOR PRODUCING THE SAME

(75) Inventors: Katsufumi Tanaka, Kariya (JP); Tomohei Sugiyama, Kariya (JP); Kyoichi Kinoshita, Kariya (JP); Eiji Kono, Kariya (JP); Naohisa Nishino, Aichi (JP)

(73) Assignee: Kabushiki Kaisha Toyota Jidoshokki, Kariya-shi (JP)

( * ) Notice: Subject to any disclaimer, the term of this patent is extended or adjusted under 35 U.S.C. 154(b) by 371 days.

(21) Appl. No.: 10/472,802

(22) PCT Filed: Mar. 14, 2002

(86) PCT No.: PCT/JP02/02453

§ 371 (c)(1),
(2), (4) Date: Sep. 23, 2003

(87) PCT Pub. No.: WO02/077304

PCT Pub. Date: Oct. 3, 2002

(65) Prior Publication Data

US 2004/0094537 A1    May 20, 2004

(30) Foreign Application Priority Data

Mar. 26, 2001    (JP)    ............... 2001-088608

(51) Int. Cl.
   *C22C 21/00*    (2006.01)
   *C22C 29/02*    (2006.01)

(52) U.S. Cl. .................. 148/437; 420/528; 428/650; 75/232; 75/249

(58) Field of Classification Search ................ 148/437; 420/528; 428/650; 75/232, 249
See application file for complete search history.

(56) References Cited

U.S. PATENT DOCUMENTS 3,877,884 A * 4/1975 Tawarada et al. ........... 148/437

(Continued)

FOREIGN PATENT DOCUMENTS

JP    11-106848    4/1999

(Continued)

*Primary Examiner*—Roy King
*Assistant Examiner*—Janelle Morillo
(74) *Attorney, Agent, or Firm*—Morgan & Finnegan, LLP

(57) ABSTRACT

The present invention is a process for producing a radiator member for electronic appliances, and is characterized in that, in a process for producing a radiator member for electronic appliances, the radiator member comprising a composite material in which SiC particles are dispersed in a matrix metal whose major component is Al, it comprises a filling step of filling an SiC powder into a mold, a pre-heating step of pre-heating the mold after the filling step to a pre-heating temperature which falls in a range of from a melting point or more of said matrix metal to less than a reaction initiation temperature at which a molten metal of the matrix metal and SiC particles in the SiC powder start to react, and a pouring step of pouring the molten matrix metal whose molten-metal temperature falls in a range of from the melting point or more of the matrix metal to less than the reaction initiation temperature, into the mold after the pre-heating step, and impregnating the SiC powder with the molten metal by pressurizing.

When the molten-metal temperature and the pre-heating temperature are from the melting point or more of the matrix metal to less than the reaction initiator temperature, it is possible to inhibit the generation of low thermal conductive materials while securing the impregnation of the molten metal into the SiC powder.

10 Claims, 2 Drawing Sheets

U.S. PATENT DOCUMENTS 6,245,442 B1   6/2001   Towata et al. .............. 428/614

FOREIGN PATENT DOCUMENTS

| JP | 11-116363   | 4/1999  |
|----|-------------|---------|
| JP | 11-170027   | 6/1999  |
| JP | 11-228261   | 8/1999  |
| JP | 11-340640   | 12/1999 |
| JP | 2000-007456 | 1/2000  |
| JP | 2000-073129 | 3/2000  |

* cited by examiner

RADIATOR MEMBER FOR ELECTRONIC APPLIANCES AND PROCESSES FOR PRODUCING THE SAME

TECHNICAL FIELD

The present invention relates to a radiator member for electronic appliances, radiator member which conducts or radiates heat, generated by electronic appliances provided with semiconductor chips and the like, to the outside, and a process for producing the same.

BACKGROUND ART

Highly integrated semiconductor chips, or modules and the like in which they are disposed on a substrate with a high density, have been used to control a variety of appliances. Devices such as semiconductor chips should be usually used in a predetermined service temperature range, and malfunction when they are used beyond the range. Accordingly, it is necessary to appropriately radiate the heat generated by semiconductor chips and so forth. In particular, the higher the degree of integration is, or the more the control currency magnitude increases, the more it is necessary to enhance the cooling capacity. Hence, it has been carried out conventionally to dispose radiator members such as heatsinks on the bottom surface of semiconductor chips or substrates.

Such radiator members are required to exhibit high thermal conductivity in order to improve the radiating ability and low thermal expandability and in order to suppress the cracks (for example, solder cracks) between radiator members and the semiconductor chips or substrates as well as the thermal strain of radiator members themselves. However, it is impossible for ordinary metallic materials such as aluminum to fully satisfy both of the characteristics which are in a trade-off relationship.

Meanwhile, when Si-based ceramic materials such as SiC are used in radiator members, it is possible to satisfy both of the characteristics at a higher order. However, ceramic materials such as SiC are poor in terms of the toughness, and are weak against shocks. The radiator members might crack, break and the like by shocks which are applied to the radiator members in processing, assembling, using and so forth.

Hence, metal-ceramic composite materials have been used in radiator members in order to satisfy the high thermal conductivity, low thermal expandability, high reliability and the like in a well balanced manner. For example, in Japanese Unexamined Patent Publication (KOKAI) No. 11-228,261, a metal-ceramic composite material for heat sinks is disclosed in which an SiC powder having a predetermined average particle diameter is dispersed in an Al—Si—Mg matrix meal. Specifically, a composite material is disclosed in which one type of an SiC powder whose average particle diameter is 20 µm approximately is dispersed (or filled) in the matrix metal in a proportion of from 60 to 70% by volume. However, the thermal conductivity of this composite material is no more than 180 W/(m·K) only.

Moreover, Japanese Unexamined Patent Publication (KOKAI) No. 11-106,848 discloses a composite material in which two types SiC powders whose average particle diameters differ are dispersed in an Al alloy. Specifically, a composite material is disclosed in which an SiC powder whose average particle diameter is 50 µm and an SiC powder whose average particle diameter is 14 µm are dispersed in an Al alloy in a proportion of from 40 to 70% by volume. However, the thermal conductivity of this composite material is also no more than 180 W/(m·K) only.

DISCLOSURE OF INVENTION

The present invention has been done in view of such circumstances. Namely, an object thereof is to provide a radiator member for electronic appliances, radiator member which comprises a composite material in which SiC particles are dispersed in a matrix metal, and which can satisfy the high thermal conductivity and low thermal expandability at a higher order.

Moreover, another object thereof is to provide a process for producing a radiator member for electronic appliances, process which can produce the same efficiently.

Hence, the present inventors have been studying earnestly in order to solve this assignment, and have been repeated trials and errors, as a result, have found out that it is possible to obtain a metal-ceramic composite material which can satisfy the high thermal conductivity and low thermal expandability at a higher order by properly setting up an average particle diameter ratio of SiC particles whose average particle diameters differ, a volumetric ratio of them and a filling factor of them with respect to a matrix metal, and have arrived at developing a radiator member according to the present invention.

Radiator Member for Electronic Appliances

Namely, a radiator member according to the present invention for electronic appliances comprises: SiC coarse particles having a larger average particle diameter; SiC fine particles having a smaller average particle diameter; and a matrix metal in which the SiC coarse particles and the SiC fine particles are dispersed and whose major component is Al, and is characterized in that it is composed of a composite material, wherein said SiC coarse particles and said SiC fine particles are present in said matrix metal in a filling factor of from 65 to 75% by volume when the entirety is taken as 100% by volume; a volumetric ratio of the SiC coarse particles with respect to the SiC fine particles is from 1.5 to 4; and an average particle diameter ratio of the SiC coarse particles with respect to the SiC fine particles is from 10 to 15.

When the SiC coarse particles and SiC fine particles whose average particle diameters differ are mixed in the matrix metal whose major component is Al, and when the average particle diameter ratio and volumetric ratio of the SiC coarse particles with respect to the SiC fine particles as well as the filling factor of them with respect to the matrix metal are set up to fall in the proper ranges as described above, a composite material can be obtained which has a remarkably high thermal conductivity while securing low expandability. Therefore, the radiator member comprising this composite material can efficiently lead the heat generated by a variety of electronic appliances to the outside, or radiate it.

By the way, the filling factor of the SiC coarse particles and SiC fine particles (hereinafter both of them are referred to as "SiC particles" collectively) are controlled to be from 65 to 75% by volume due to the following reasons.

In the case of metal-ceramic composite materials, the linear expansion coefficient substantially follows the proportion of matrix metal and ceramic particles (or dispersion particles), namely, the law of mixture. The SiC particles being the dispersion particles exhibit a far less linear expansion coefficient than that of Al being a major component of the matrix metal. Therefore, the larger the filling factor of the SiC particles into the matrix metal is, the smaller linear expansion coefficient the composite material exhibits. Hence, from the viewpoint of securing sufficiently low expandability as radiator members, the filling factor is controlled to be 65% by volume or more. On the other hand, when the filling factor exceeds 75% by volume, the SiC particles are impregnated with the matrix metal insufficiently so that it is difficult to secure the toughness or shock resistance for radiator members. Hence, the filling factor is controlled to be from 65 to 75% by volume, however, the filling factor can further preferably be controlled to be from 68 to 72% by volume.

However, the present inventors have confirmed by a diversity of experiments that such a high filling factor cannot be obtained independently of the particle diameter and the like of the SiC particles. And, when the SiC fine particles having a smaller average particle diameter enter gaps formed between the SiC coarse particles having a larger average particle diameters, it is possible to enhance the filling factor, however, this cannot simply result in obtaining a sufficient filling factor. Namely, when the average particle diameter ratio of the SiC coarse particles with respect to the SiC fine particles is controlled to be from 10 to 15 and the volumetric ratio of them is controlled to be from 1.5 to 4, it is understood that the filling factor of them can be further enhanced. In addition, it is understood as well that the thermal conductivity can be enhanced remarkably in this instance together with the high filling factor.

On the other hand, the thermal conductivity of the composite material as a whole does not simply follow the law of mixture, contrary to the linear expansion coefficient. Namely, in addition to the filling factor, the magnitude of the interfacial area formed between the matrix metal and the SiC particles influences the magnitude of the thermal conductivity greatly. For example, when the interfacial area enlarges, the heat transfer is carried out frequently between the SiC particles and the matrix metal so that heat can transmit in the composite material. As a result, the effect of high thermal conductivity resulting from the SiC particles is reduced so that the thermal conductivity of the composite material lowers as a whole.

When the above-described average particle diameter ratio exceeds 15, or when the volumetric ratio is less than 1.5, it is not preferable because the interfacial area formed between the SiC particles and the matrix metal increases so that the thermal conductivity decreases. On the other hand, when the average particle diameter ratio is less than 10, or when the volumetric ratio exceeds 4, it is not preferable because the SiC fine particles enter less between the SiC coarse fine particles so that no satisfactory filling factor can be obtained. And, it is further preferable to control the average particle diameter ratio from 11 to 14, or the volumetric ratio from 2 to 3.

Production Process of Radiator Member for Electric Appliances

The above-described radiator member can be produced by a variety of methods, however, it is suitable therefor to use the following production process according to the present invention, for example.

Namely, a process according to the present invention for producing a radiator member for electronic appliances is characterized in that it comprises: a filling step of filling an SiC powder into a mold, SiC powder in which an average particle diameter ratio of SiC coarse particles having a larger particle diameter with respect to SiC fine particles having a smaller particle diameter is from 10 to 15, in which a volumetric ratio of the SiC coarse particles with respect to the SiC fine particles is from 1.5 to 4, and in which the SiC coarse particles and the SiC fine particles are mixed; and a pouring step of pouring a molten matrix metal whose major component is Al into the mold in which the SiC powder is filled, and impregnating the SiC powder with the molten metal by pressurizing, thereby making a filling factor of the SiC powder from 65 to 75% by volume when the entirety is taken as 100% by volume.

This production process is a type of pressurizing impregnation methods, however, the major characteristic is that the SiC powder which has the specific average particle ratio and volumetric ratio is filled into the mold directly. Accordingly, the preliminary forming of SiC powders which has been carried out conventionally is not needed at all so that it is possible to lower the cost by reducing the number of production steps. Moreover, no binders for the forming are needed at all so that it is possible to inhibit the thermal conductivity from lowering which results from the intervention of binders.

Note that the numerical limitations on the average particle diameter ratio, volumetric ratio and filling factor according to this production process mean as described above.

BEST MODE FOR CARRYING OUT THE INVENTION

A. Mode for Carrying Out

Figure 1:
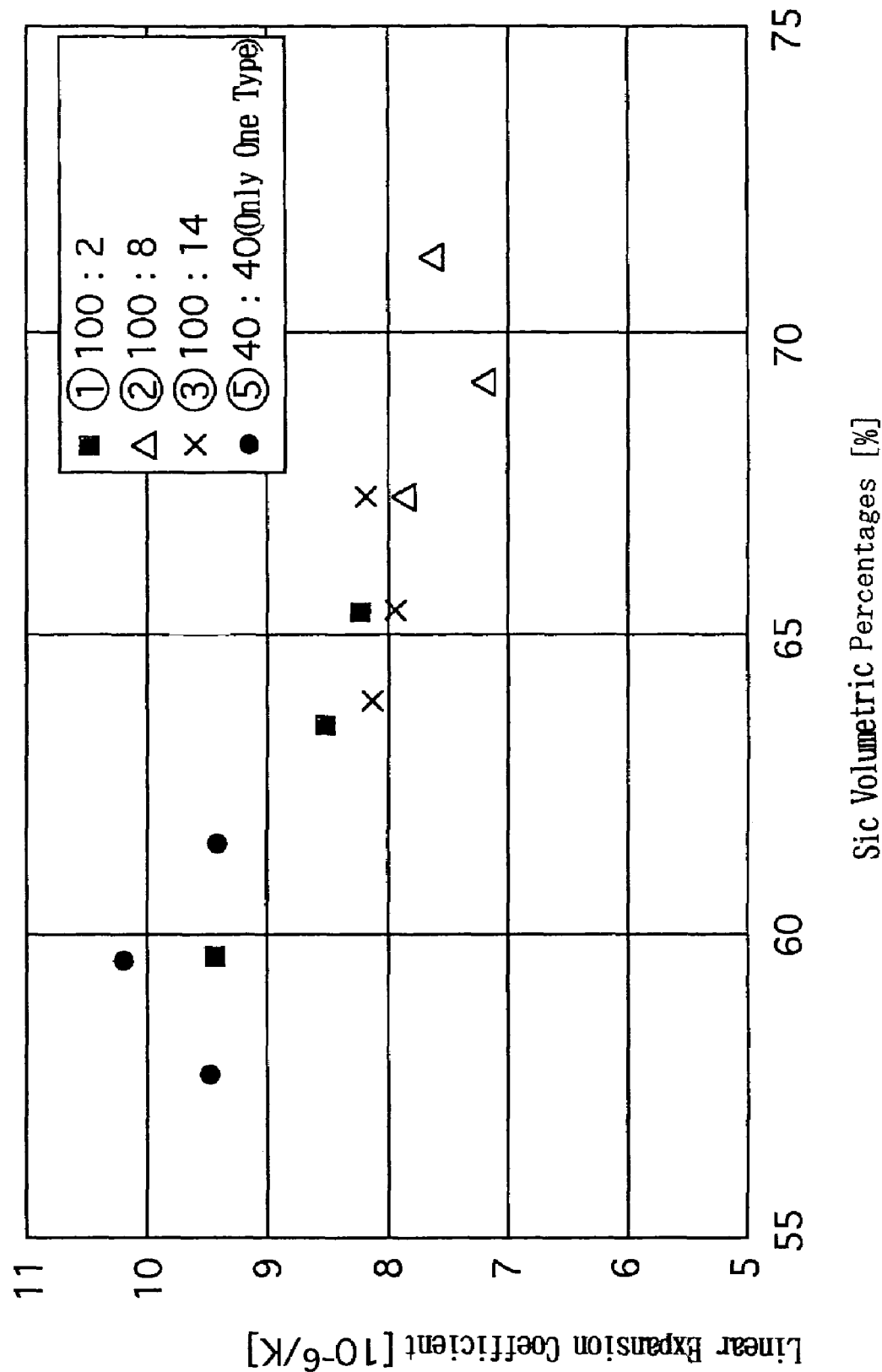
FIG. 1 is a graph for illustrating the relationships between SiC volumetric percentages and linear expansion coefficients according to a present example.

Hereinafter, while naming embodiment modes, the present invention will be described more specifically.

(1) Composite Material

① SiC Particles

The composite material constituting the present radiator member for electronic appliances comprises an Al-based matrix metal, and predetermined SiC coarse particles and SiC fine particles dispersed in the Al-based matrix metal.

Here, it is suitable that the SiC coarse particles can have an average particle diameter of from 50 to 300 μm, and that the SiC fine particles can have an average particle diameter of from 5 to 30 μm.

When the average particle diameter of the SiC coarse particles is less than 50 μm, it is not preferable in view of improving the thermal conductivity because said interfacial area enlarges. When the average particle diameter exceeds 300 μm, it is difficult to process the resulting composite materials.

When the average particle diameter of the SiC fine particles is less than 5 μm, it is difficult to uniformly disperse them in the matrix metal because the SiC fine particles are likely to agglomerate. When the average particle diameter exceeds 30 μm, it is difficult for them to enter the gaps formed between the SiC coarse particles, moreover, it is less likely to secure the above-described proper average particle diameter ratio.

It is further preferred that the SiC coarse particles can have an average particle diameter of from 50 to 200 μm, from 75 to 150 μm, furthermore from 75 to 125 μm. Moreover, it is further preferred that the SiC fine particles can have an average particle diameter of from 5 to 20 μm, from 5 to 15 μm, furthermore from 7 to 10 μm.

Here, the average particle diameter is an average of particle diameters measured by using a screening testing method and an electric resistance method (JIS R6002).

Note that, without departing from the spirit or scope of the present invention, this composite material can also include third particles (SiC particles whose particle diameter is different, the other ceramic particles, or the like) other than the SiC coarse particles and SiC fine particles.

② Matrix Metal

The matrix metal is those whose major component is Al, however, is pure Al (99% or more) or Al alloys specifically. When Al alloys are used, it is suitable to add alloying elements in such a proper amount that the thermal conductivity can be improved.

(2) Production Process of Radiator Member

① Filling Step

The filling step of the production process according to the present invention requires an SiC powder. This SiC powder can be those in which the above-described SiC coarse particles and SiC fine particles are mixed, and the generation method does not matter at all. It is possible to prepare it by mechanically or chemically pulverizing SiC. Indeed, it is possible to prepare it by mixing commercially available SiC powders with the above-described average particle diameter ratio and volumetric ratio.

② Pouring Step

The temperature range of the molten matrix metal depends on the composition, however, can be the melting point or more naturally and can preferably be lower than the temperature at which the molten metal and SiC start to react. For example, when the matrix metal is pure Al (melting point: 660° C.), it is preferred that the molten-metal temperature can be from 700 to 800° C., further from 750 to 800° C. Note that it is preferred that the mold can be pre-heated to the same extent.

The pressure applied to the molten metal can be pressures at which the SiC powder is impregnated with the molten matrix metal sufficiently. For example, when said pure Al-molten metal is used, it is preferred that it can be from 70 to 120 MPa.

Note that it is needless to say that a cooling-solidification step, a removing step, a processing step and the like can be carried out appropriately after the pouring step.

The pressurizing impregnation method is described herein, however, a molten metal stirring method, a non-pressurizing impregnation method, a liquid phase forming method and the like can be used as far as possible.

(3) Radiator Member for Electronic Appliances

The radiator member for electronic appliances is those which transmit the heat generated by electronic appliances to the outside in order to radiate it, and is not limited to so-called heatsinks. For example, the radiator member can be used as thermal expansion-adjusting members which intervene between heatsinks and ceramic substrates to carry out heat transfer, storage cases for electronic appliances, and the like.

B. EXAMPLES

While naming specific examples hereinafter, the present invention will be hereinafter described in more detail.

Production Process of Radiator Member

As a radiator member according to the present invention for electronic appliances, a 3×50×80 mm plate-shaped member was manufactured which comprised an Al-Si composite material.

As SiC particles being dispersion particles, commercially available SiC powders (produced by SHOWA DENKO Co., Ltd.) were used whose average particle diameters differed. The prepared SiC powders were such that the average particle diameters of the SiC particles were 5 types, 2 μm, 8 μm, 14 μm, 40 μm and 100 μm.

From these SiC powders, 5 types of SiC mixture powders were prepared (a mixing step) whose (Average Particle Diameter of SiC coarse particles):(Average Particle Diameter of SiC fine particles) was ① 100:2 (=50), ② 100:8 (=12.5), ③ 100:14 (=7.1), ④ 14:2 (=7) and ⑤ 40:40 (=1, only 40 μm). Note that the numerical values in parenthesis are average particle diameter ratios. The mixing ratio in this instance was SiC coarse particles/SiC fine particles=7/3 (=2.3). Note that the numerical value in parenthesis is a volumetric ratio.

Next, the thus prepared SiC mixture powders were filled into a dented mold cavity conforming to said plate-shaped member (a filling step). In this filling, no pressurizing was done particularly.

Subsequently, a molten metal was prepared in which pure Al (JIS 1050) being a matrix metal was melt. While keeping the temperature of this molten metal from 750 to 800° C., the molten metal was poured through a sprue of the mold and was pressurized (a pouring step). The pressurizing force in this instance was 100 MPa. In this case, the mold was heated to 700° C. in advance. Thus, cares were taken in order that the molten metal was inhibited from locally quenching to solidify, and that the SiC powders were fully impregnated with the molten metal. Note that, for each of the above-described respective SiC mixture powders, the filling factor was varied in three stages when the pouring step was carried out.

After this pouring step, the mold was cooled, and cast products were taken out of the mold, thereby obtaining Al-SiC composite materials (radiator members). Note that, depending on needs, it is good to carry out cutting the composite materials to secure surface roughness, flatness and the like for a surface contacting with electronic appliances, though it was not carried out in the present example.

Measurements on Radiator Members

Figure 2:
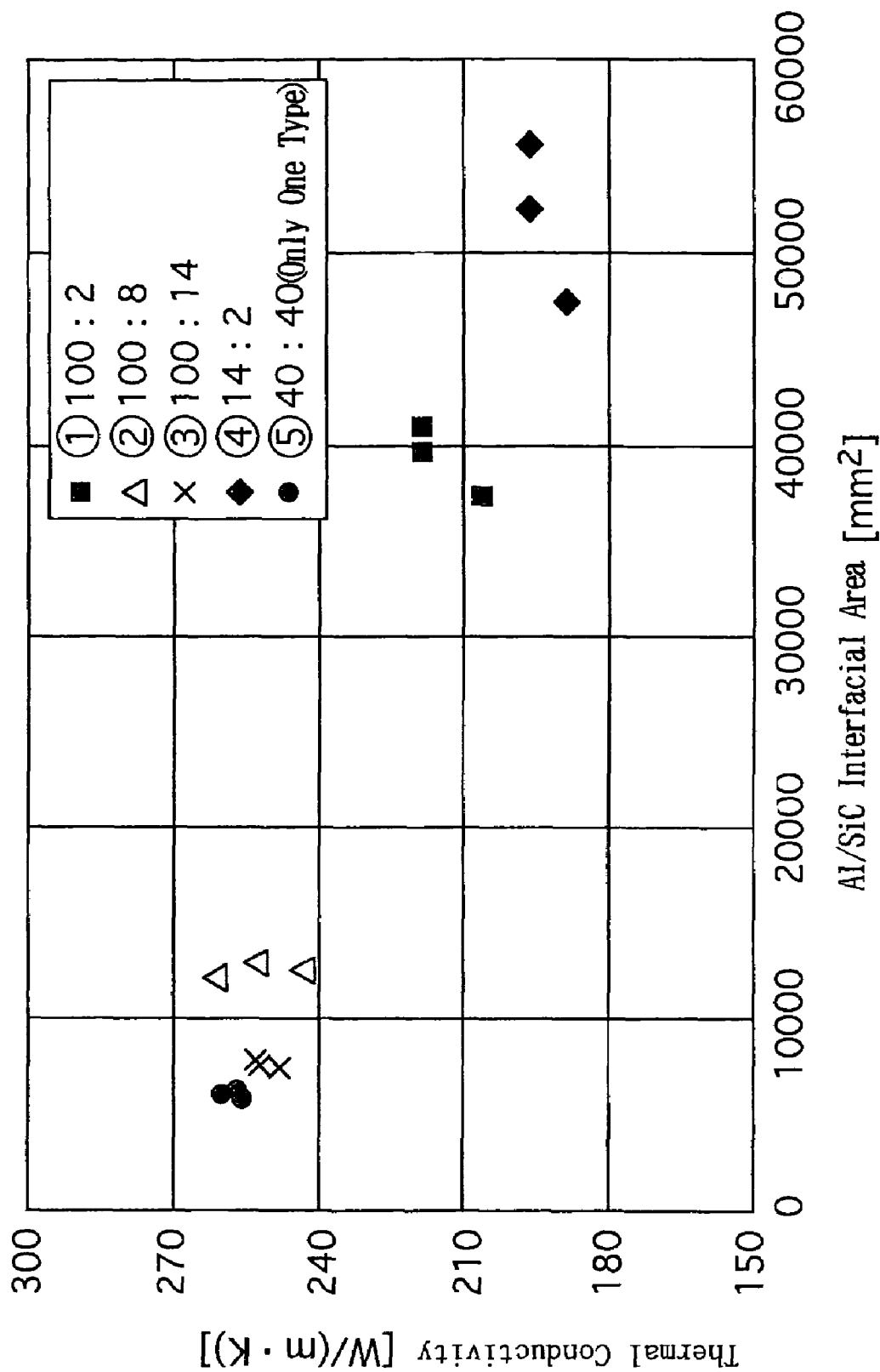
FIG. 2 is a graph for illustrating the relationships between Al/SiC interfacial areas and thermal conductivities according to a present example.

On a diversity of the resulting radiator members, the linear expansion coefficient and the thermal conductivity were measured, and were plotted in FIG. 1 and FIG. 2, respectively. FIG. 1 is a graph in which the horizontal axis specifies the SiC volumetric percentages being the filling factors and the vertical axis specifies the linear expansion coefficients to illustrate the relationships between them. However, regarding the radiator member using the SiC mixture powder (average particle diameter ratio=7) labeled ④ 14:2 as described above, the linear expansion coefficient was not measured.

FIG. 2 is a graph in which the horizontal axis specifies the interfacial areas between the matrix metal (Al) and the dispersion particles (SiC) and the vertical axis specifies the thermal conductivities to illustrate the relationships between them.

Note that the filling factors were found by an Archimedes method. The linear expansion coefficients were found by using a thermomechanical analyzer (produced by SEIKO INSTRUMENT Co., Ltd.: DSC220C) in accordance with JIS. The thermal conductivities were found by using a laser flash method-thermal constant measuring apparatus (SHINKU RIKO Co., Ltd.: TC-700) by means of JIS R1611.

Assessment

From FIG. 1, it is understood that the filling factor of Sample ②, in which the SiC coarse particles having the average particle diameter of 100 μm and the SiC fine particles having the average diameter of 8 μm were combined, was as high as around 70% by volume, and that the linear expansion coefficient was from 7 to 8 ($10^{-6}$/K) and was the lowest. Moreover, from FIG. 2, it is understood as well that the Al/SiC interfacial area of Sample ② was as small as 12,000 $mm^2$ approximately, and that the thermal conductivity was as remarkably high as from 245 to 265 (W/(m·K)).

And, this Sample ② was such that the filling factor was from 68 to 72% by volume, the average particle diameter ratio was 12.5 and the volumetric ratio was 2.3, and accordingly is included in the scope of the present invention.

Thus, in accordance with the present radiator member for electronic appliances, it is possible to obtain a remarkably high thermal conductivity while securing low thermal expandability. Moreover, in accordance with the present production process, it is possible to efficiently produce the radiator member for electronic appliances.

The invention claimed is:

1. A radiator member for dissipating heat in electronic appliances in which a molten matrix metal is impregnated into an SiC powder which is not sintered and in which SiC coarse particles and SiC fine particles are mixed, the radiator member comprising:

SiC coarse particles having a larger average particle diameter, said average particle diameter being from 75 to 125 μm;

SiC fine particles having a smaller average particle diameter, said average particle diameter being from 7 to 15 μm; and a matrix metal in which the SiC coarse particles and the SiC fine particles are dispersed and whose major component is Al and being characterized in that it is composed of a composite material, wherein said SiC coarse particles and said SiC fine particles are present in said matrix metal in a filling factor of from 65 to 75% by volume when the entirety is taken as 100% by volume; a volumetric ratio of the SiC coarse particles with respect to the SiC fine particles is from 1.5 to 4; and an average particle diameter ratio of the SiC coarse particles with respect to the SiC fine particles is from 11 to 14.

2. The radiator member for electronic appliances set forth in claim 1, wherein said filling factor is from 68 to 72% by volume.

3. The radiator member for electronic appliances set forth in claim 1, wherein said volumetric ratio is from 2 to 3.

4. The radiator member for electronic appliances set forth in claim 1, wherein said average particle diameter ratio is from 11 to 14.

5. A process for producing a radiator member for dissipating heat in electronic appliances in which a molten matrix metal whose major component is Al is impregnated into an SiC powder which is not sintered and in which SiC coarse particles and SiC fine particles are mixed, being characterized in that it comprises:

a filling step of filling an SiC powder into a mold;

SiC powder in which an average particle diameter ratio of SiC coarse particles having a larger particle diameter with respect to SiC fine particles having a smaller particle diameter is from 11 to 14, in which a volumetric ratio of the SiC coarse particles with respect to the SiC fine particles is from 1.5 to 4, and in which the SiC coarse particles and the SiC fine particles are mixed, said SiC coarse particles having an average particle diameter of from 75 to 125 μm and said SiC fine particles having an average particle diameter of from 7 to 15 μm; and a pouring step of pouring the molten matrix metal into the mold in which the SiC powder is filled, and impregnating the SiC powder with the molten metal by pressurizing, thereby making a filling factor of the SiC powder from 65 to 75% by volume when the entirety is taken as 100% by volume.

6. The process for producing a radiator member for electronic appliances set forth in claim 5, wherein said molten matrix metal is a pure Al-molten metal.

7. The process for producing a radiator member for electronic appliances set forth in claim 6, wherein a temperature of said molten metal is from 700 to 800° C.

8. The process for producing a radiator member for electronic appliances set forth in claim 5, wherein said filling factor is from 68 to 72% by volume.

9. The process for producing a radiator member for electronic appliances set forth in claim 5, wherein said volumetric ratio is from 2 to 3.

10. The process for producing a radiator member for electronic appliances set forth in claim 5, wherein said average particle diameter ratio is from 11 to 14.

* * * * *

UNITED STATES PATENT AND TRADEMARK OFFICE
CERTIFICATE OF CORRECTION

| | |
|---|---|
| PATENT NO. | : 7,364,632 B2 |
| APPLICATION NO. | : 10/472802 |
| DATED | : April 29, 2008 |
| INVENTOR(S) | : Katsufumi Tanaka et al. |

It is certified that error appears in the above-identified patent and that said Letters Patent is hereby corrected as shown below:

Cover Page

At (75) Inventors:, please delete "Aichi (JP)" and insert therefore -- Aichi-ken (JP) --;

In the Specification

Column 1, line 8, please delete "radiator member which conducts" and insert therefore -- the radiator member conducts --;

Column 1, line 59, please delete "180 W/(m·K) only." and insert therefore -- 180 W/(m·K). --;

Column 2, line 2, please delete "180 W/(m·K) only." and insert therefore -- 180 W/(m·K). --;

Column 2, lines 8-9, please delete "radiator member which comprises" and insert therefore -- the radiator member comprises --;

Column 2, line 15, please delete "process which can produce the same efficiently." and insert therefore -- the process producing the same efficiently. --;

Column 2, lines 17-18, please delete "and have been repeated trials and errors, as a result, have found out that it is possible" and insert therefore -- and have found, through repeated trial and error, that it is possible --;

Column 3, line 3, please delete "into the matrix metal is, the smaller" and insert therefore -- into the matrix metal, the smaller --;

Column 3, lines 51-52, please delete "SiC coarse fine particles" and insert therefore -- SiC coarse particles --;

Column 3, line 67, please delete "mold, SiC powder in which an average" and insert therefore -- mold, the SiC powder with an average --;

Column 4, line 3, please delete "diameter is from" and insert therefore -- diameter of from --;

Column 4, lines 13-14, please delete "pressurizing impregnation methods," and insert therefore -- pressurizing impregnation method, --;

UNITED STATES PATENT AND TRADEMARK OFFICE
CERTIFICATE OF CORRECTION

PATENT NO. : 7,364,632 B2
APPLICATION NO. : 10/472802
DATED : April 29, 2008
INVENTOR(S) : Katsufumi Tanaka et al.

It is certified that error appears in the above-identified patent and that said Letters Patent is hereby corrected as shown below:

Column 4, line 26, please delete "production process mean as described above." and insert therefore -- production process are significant as described above. --;

Column 5, line 17, please delete "different, the other ceramic particles," and insert therefore -- different, other ceramic particles --;

Column 5, line 23, please delete "The matrix metal is those" and insert therefore -- The matrix metal is one --;

Column 5, line 24, please delete "however, is pure Al" and insert therefore -- however, it is pure Al --;

Column 5, line 35, please delete "can be those in which" and insert therefore -- can be one in which --;

Column 5, lines 47-48, please delete "however, can be the melting point or more naturally and can preferably be lower" and insert therefore -- however, it can be the melting point or more naturally can preferably be lower --;

Column 6, lines 3-4, please delete "is those which transmit" and insert therefore -- is one which transmits --;

Column 6, line 44, please delete "a matrix metal was melt." and insert therefore -- a matrix metal was melted. --; and

UNITED STATES PATENT AND TRADEMARK OFFICE
CERTIFICATE OF CORRECTION

PATENT NO. : 7,364,632 B2
APPLICATION NO. : 10/472802
DATED : April 29, 2008
INVENTOR(S) : Katsufumi Tanaka et al.

It is certified that error appears in the above-identified patent and that said Letters Patent is hereby corrected as shown below:

Column 6, line 49, please delete "Thus, cares were taken" and insert therefore -- Thus, care was taken --.

Signed and Sealed this

Fifteenth Day of December, 2009

David J. Kappos
*Director of the United States Patent and Trademark Office*